US008862417B2

(12) United States Patent
Chu et al.

(10) Patent No.: US 8,862,417 B2
(45) Date of Patent: Oct. 14, 2014

(54) SYSTEMS AND METHODS FOR DETERMINING ADJUSTABLE WAFER ACCEPTANCE CRITERIA BASED ON CHIP CHARACTERISTICS

(75) Inventors: Albert M. Chu, Essex, VT (US); Eric D. Johnson, Westford, VT (US); William J. Rensch, Williston, VT (US); Manikandan Viswanath, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 688 days.

(21) Appl. No.: 13/151,337

(22) Filed: Jun. 2, 2011

(65) Prior Publication Data

US 2012/0310574 A1    Dec. 6, 2012

(51) Int. Cl.
*G01N 37/00* (2006.01)
*G06F 17/50* (2006.01)
*H01L 21/66* (2006.01)

(52) U.S. Cl.
CPC ............... *H01L 22/20* (2013.01); *H01L 22/12* (2013.01); *H01L 22/14* (2013.01)
USPC .......................................... 702/81; 716/110

(58) Field of Classification Search
USPC ............... 702/81, 84–85, 108, 117, 127, 137, 702/182–183, 189; 257/48; 716/100, 716/110–112, 116, 136; 438/7, 10–12, 438/14–18
See application file for complete search history.

(56) References Cited

U.S. PATENT DOCUMENTS

| 6,028,994 A | 2/2000 | Peng et al. |
| 6,240,329 B1 | 5/2001 | Sun |
| 6,917,849 B1 | 7/2005 | Pasadyn et al. |

OTHER PUBLICATIONS

Brodsky et al., Lithography Budget Analysis at the Process Module Level, 2006, Proc. of SPIE, vol. 6154, 12 pp.*

* cited by examiner

*Primary Examiner* — Toan Le
(74) *Attorney, Agent, or Firm* — David Cain; Roberts Mlotkowski Safran & Cole, P.C.

(57) ABSTRACT

Systems and methods for determining adjustable wafer acceptance criteria based on chip characteristics. The method includes measuring a density of at least one chip. The method further includes computing a difference in density between the density of the at least one chip and a density of at least one kerf structure. The method further includes calculating an offset value to modify a Wafer Acceptance Criteria (WAC) to match the density difference between the at least one chip and the at least one kerf structure. The method further includes applying the offset value to the WAC for a wafer level measurement in order to increase chip yield performance.

20 Claims, 9 Drawing Sheets

SYSTEMS AND METHODS FOR DETERMINING ADJUSTABLE WAFER ACCEPTANCE CRITERIA BASED ON CHIP CHARACTERISTICS

FIELD OF THE INVENTION

The invention relates to semiconductor device fabrication processes and, more particularly, to systems and methods for determining adjustable wafer acceptance criteria based on chip characteristics.

BACKGROUND

The fabrication of semiconductor devices is a complex process that varies from one device to another device, depending on design specifications. For this and many other reasons, the manufacture of semiconductor devices requires careful monitoring to ensure adequate quality control, which, in turn, allows a fabrication facility to maintain acceptable product yields.

As one such monitoring process, wafer screening is performed during the semiconductor device fabrication process to monitor the function and performance of chips fabricated on the wafer. In particular, wafer screening criteria consists of a rigid set of predefined kerf parameters that are independent of the chips, and are defined by a design manual and wafer acceptance criteria (WAC). For example, the WAC are designed in order to determine acceptance of the wafer. This acceptance can be defined by any number of parameters that an inline kerf structure is configured to measure. The measurements of the inline kerf structure may then be specified (e.g., spec'ed) to the WAC to determine acceptance of the wafer. Using the rigid set of predefined kerf parameters, a set number of inline kerf structures are tested, which are used in a statistical analysis. If a certain number of these inline kerf structures fail, then the entire wafer will be discarded, regardless of individual chips meeting performance standards. This can result in lower yields.

More specifically, selecting or sorting the chips based on a fixed set of WAC may cause a circuit limited yield for the chips since the predefined kerf limits may not accurately reflect the chip performance. For example, the performance of the inline kerf structure does not accurately reflect the performance of each chip on the wafer, and miscorrelation of kerf measurements to chips can result in poor selection of customer dies. The largest contributor to this miscorrelation issue is systematic kerf-to-chip offset. Factors influencing this kerf-to-chip offset include: PC density (perimeter density or Pden), layout differences between the kerf structure and the chip, n-well stress factors, shallow trench isolation (STI) factors, across chip line width variation (ACLV), front end of line (FEOL) variations, back end of line (BEOL) variations, etc. Dies (chips) picked based entirely on kerf data (in specification) can result in out of specification chip performance (circuit limited yield) due to this kerf-to-chip offset.

To complicate matters, several different designs (e.g., chips) can be manufactured on a single multi-project wafer (MPW) process. In this scenario, each chip can be different with the on-chip FET performance varying depending on the physical attributes of the chip design. In such a scenario, ensuring quality and yield becomes exceptionally complicated, taking into account the many different designs that may be on a single wafer.

For example, it is known that each reticle (design for a die or chip) has a line monitor (i.e., inline kerf structures). Taking into account that the wafer may include 60 to 70 reticles depending on wafer requirements, there can be 60 to 70 or more line monitors (i.e., inline kerf structures) on a single wafer. Generally, testing is not performed on all of these inline kerf structures; instead, the fabrication facility will test only a sample of these inline kerf structures and, using statistical analysis, will determine whether the entire wafer has passed. However, even if the wafer passed or failed, the tested inline kerf structures may not be deterministic of all of the dies (e.g., chips) on the wafer, leading to yield issues.

Accordingly, there exists a need in the art to overcome the deficiencies and limitations described hereinabove.

SUMMARY

In a first aspect of the invention, a method comprises measuring a density of at least one chip. The method further comprises computing a difference in density between the density of the at least one chip and a density of at least one kerf structure. The method further comprises calculating an offset value to modify a Wafer Acceptance Criteria (WAC) to match the density difference between the at least one chip and the at least one kerf structure. The method further comprises applying the offset value to the WAC for a wafer level measurement in order to increase chip yield performance.

In another aspect of the invention, a method comprises generating a density map of a chip. The method further comprises determining an offset from a point of interest in the chip to a kerf structure. The method further comprises computing a performance shift for chip performance versus kerf structure performance. The method further comprises determining a deviation offset between the chip performance versus the kerf structure performance. The method further comprises applying the deviation offset to kerf Wafer Acceptance Criteria (WAC) screening criteria.

In yet another aspect of the invention, a computer system is provided for untested chip selection. The computer system comprises a CPU, a computer readable memory and a computer readable storage media. The computer system further comprises first program instructions to measure a density of at least one chip. The computer system further comprises second program instructions to compute a difference in density between the density of the at least one chip and a density of at least one kerf structure. The computer system further comprises third program instructions to calculate an offset value to modify a Wafer Acceptance Criteria (WAC) to match the density difference between the at least one chip and the at least one kerf structure. The computer system further comprises fourth program instructions to apply the offset value to the WAC for a wafer level measurement in order to increase chip yield performance. The computer system further comprises that the first through fourth program instructions are stored on the computer readable storage media for execution by the CPU via the computer readable memory.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of an adjustable wafer screening system, which comprises the structures of the present invention. In still further embodiments, a method in a computer-aided design system is provided for generating a functional design model of the adjustable wafer screening system. The method comprises generating a functional representation of the structural elements of the adjustable screening system.

BRIEF DESCRIPTION OF THE SEVERAL VIEWS OF THE DRAWINGS

The present invention is described in the detailed description, which follows, in reference to the noted plurality of drawings by way of non-limiting examples of exemplary embodiments of the present invention.

DETAILED DESCRIPTION

The invention relates to semiconductor device fabrication processes and, more specifically, to systems and methods for determining an adjustable wafer acceptance criteria based on chip characteristics. In embodiments, the adjustable wafer acceptance criteria can be used to increase chip yield by selecting chips that are within performance parameters, regardless of the measured kerf data results. In embodiments, the present invention may use a ring oscillator (or a critical path, or a performance sort ring oscillator (PSRO), or any critical structure) placed within the chip design, e.g., placed at different locations with the chip, to measure device performance and make appropriate adjustments. These different locations may be representative of different densities of the chip. Kerf-to-chip performance offsets can be calculated from differences in density between the different locations of the chip and a density of a kerf structure. Once the offsets are quantified, WAC targets for chips with various parameter densities can be established. In embodiments, once the targets are established, corresponding optimized pick maps may be produced in accordance with aspects of the present invention, in order to optimize the selection process.

Advantageously, die selection can be based on kerf FEOL and BEOL performance by use of the WAC, measured at a final metal level test. This improves the device performance yield of selected active devices. In addition, advantageously, the die selection technique can be used to adjust in-line parameters to screen wafers to ensure chip performance is within specifications. It should be noted that the terms "die" and "chip" are used interchangeably herein.

Figure 1:
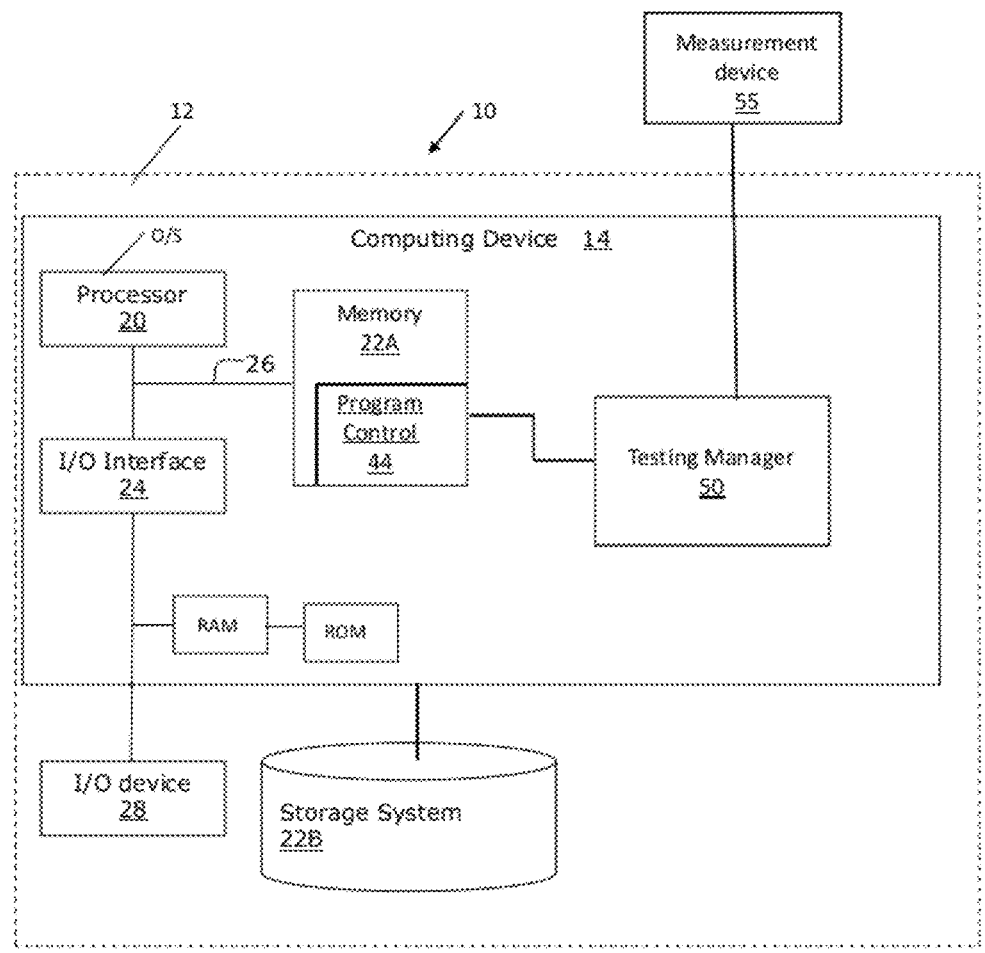
FIG. 1 shows an illustrative environment for managing the processes in accordance with the invention.

Referring to FIG. 1, as will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

More specifically, FIG. 1 shows an illustrative environment 10 for managing the processes in accordance with the invention. To this extent, the environment 10 includes a server or other computing system 12 that can perform the processes described herein. In particular, the server 12 includes a computing device 14. The computing device 14 can be resident on a network infrastructure or computing device of a third party service provider (any of which is generally represented in FIG. 1).

The computing device 14 also includes a processor 20, memory 22A, an I/O interface 24, and a bus 26. The memory 22A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 14 is in communication with the external I/O device/resource 28 and the storage system 22B. For example, the I/O device 28 can comprise any device that enables an individual to interact with the computing device 14 (e.g., user interface) or any device that enables the computing device 14 to communicate with one or more other computing devices using any type of communications link. The external I/O device/resource 28 may be for example, a handheld device, PDA, handset, keyboard etc.

The processor 20 executes computer program code (e.g., program control 44), which can be stored in the memory 22A and/or storage system 22B. While executing the computer program code, the processor 20 can read and/or write data to/from memory 22A, storage system 22B, and/or I/O interface 24. Moreover, in accordance with aspects of the invention, the program control 44 controls a testing manager 50, e.g., the processes described herein.

The testing manager 50 communicates with one or more measurement devices 55 in order to carry out processes of the invention. For example, the one or more measurement devices 55 can measure a density of selected areas of separate dies (e.g., transistors on a chip) on a single wafer, and compare this density to the known density of a wafer based measurement site (e.g., a kerf structure). The testing manager 50 can use the density measurements to compute a difference between the at least one die (e.g., transistors on a chip) and the wafer based measurement site (e.g., a kerf structure) to compute adjusted values, e.g., an increase or decrease of channel lengths, for example. The testing manager 50 can use the adjusted values to compute an offset value, for example, delay target values, which can then be applied to WAC criteria for a wafer level measurement. The testing manager 50 can accept the at least one die when the wafer level measurement falls within a range of the WAC criteria as compensated by the offset value; whereas, the testing manager 50 can reject the at least one die for further processing when the wafer level measurement falls outside the range of the WAC criteria as compensated by the offset value.

While executing the computer program code, the processor 20 can read and/or write data to/from memory 22A, storage system 22B, and/or I/O interface 24. The program code executes the processes of the invention such as, for example, generating a PC density map of a chip, determining an offset from a point of interest in the chip to the kerf structure, and computing performance shift between the chip and the kerf structure.

Figure 2:
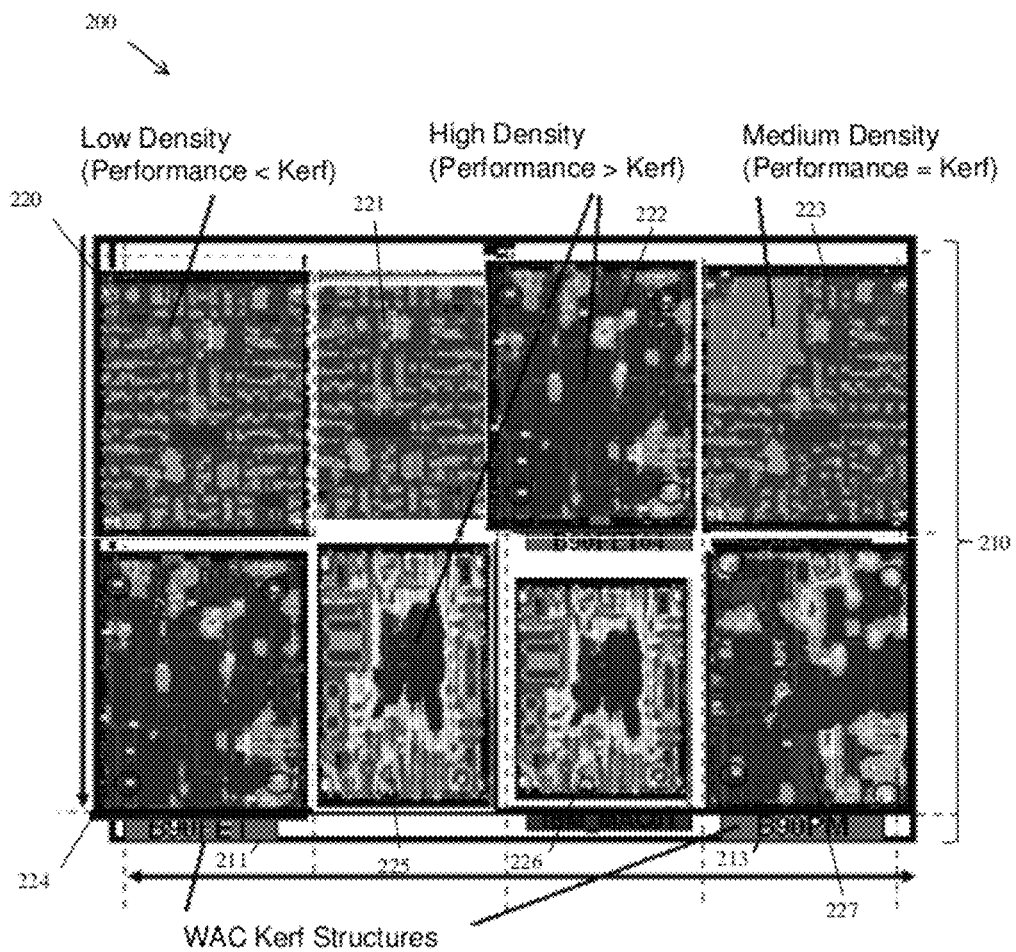
FIG. 2 shows an illustrative density map in accordance with aspects of the invention.

FIG. 2 shows an example of a density map 200 for a single reticle 210 of a MPW in accordance with aspects of the invention. The density map 200 can be created by heat mapping, which shows the density variations of chips on a single wafer. In the density map 200 of FIG. 2, the medium gray color is indicative of a low density region, the light gray color is indicative of a medium density region, and the black is indicative of a high density region. The density range can be divided into levels ranging from, e.g., 1-9 (1 representing a low density and 9 representing a high density); although other density ranges are contemplated by the present invention. In embodiments, a density range of 5 to 6 is optimal; although other ranges are contemplated by the present invention.

In this mapping of FIG. 2, the level of density may be indicative of performance of a chip relative to the kerf structure. By way of illustration, FIG. 2 shows WAC kerf structures 211 and 213, and chips 220, 221, 222, 223, 224, 225, 226, and 227. In an illustrative example, the kerf structure 211 or 213 of the reticle 210 may have a density level of 5 or 6, which is compared to a chip 220 with a low density level (e.g., 2). Consequently, the low density level for chip 220 may be indicative of the chip performing at a reduced level as compared to the kerf structure 211 or 213. Also for example, the chip 223 may have a medium density level (e.g., 6). Consequently, the medium density level for chip 223 may be indicative of the chip performing at a substantially same level as the kerf structure 211 or 213. Also for example, the chip 222 may have a high density level (e.g., 8). Consequently, the high density level for chip 222 may be indicative of the chip performing at a high level as compared to the kerf structure 211 or 213.

However, the performance data of FIG. 2, i.e., kerf to chip offsets, may cause a circuit limited yield for the chips since the predefined kerf limits may not accurately reflect the chip performance. Accordingly, the present invention can use the density measurements of FIG. 2 to compute and offset value to match the density differences in order to accept the chip when the wafer level measurement falls within at least one WAC criteria as compensated by the offset value; whereas, the present invention can reject the at least one chip for further processing when the wafer level measurement falls outside the at least one WAC criteria as compensated by the offset value.

Figure 3:
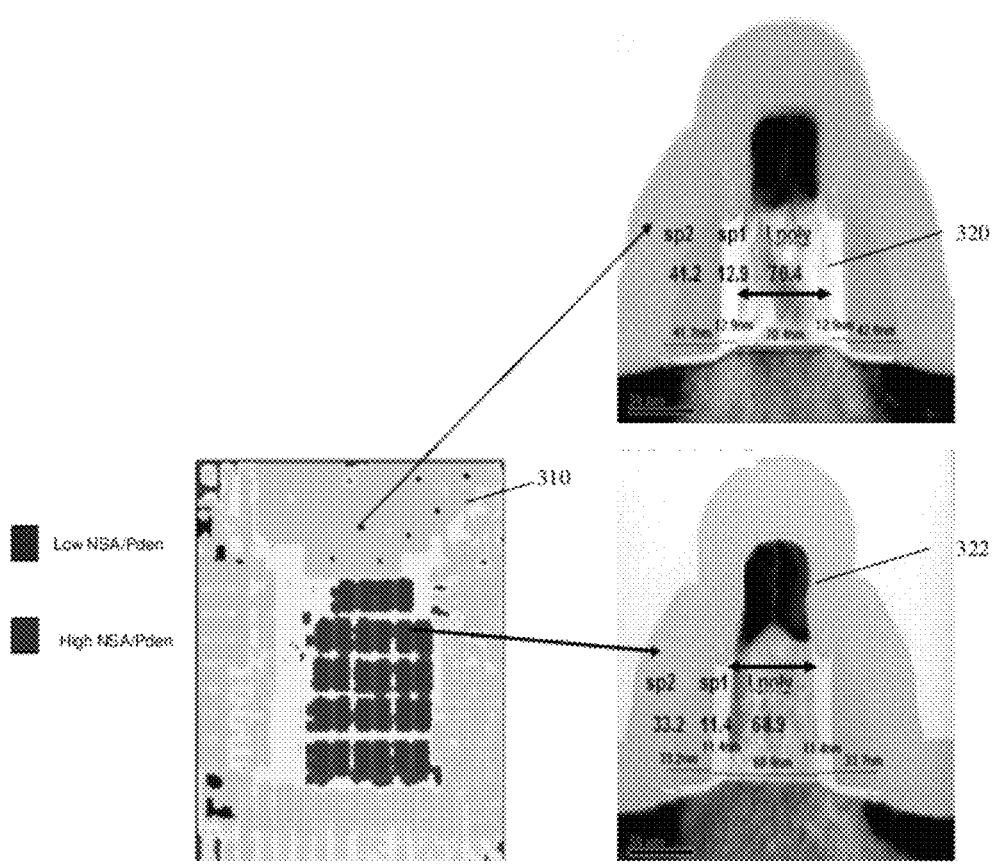
FIG. 3 shows an illustrative density map in accordance with aspects of the invention.

FIG. 3 shows an example of a density map 310 with two exemplary FETS 320 and 322. In embodiments, the FET 320 is located in a low density region of the chip and the PET 322 is located in a high density region of the chip. As can be seen in FIG. 3, the FET 320 has a channel region of Lpoly that is 70.4 nm wide. In contrast, the FET 322 has a channel region of Lpoly that is 68.9 nm. This difference in the width of the channel region between FETS 320 and 322 is a result of the density of the region of the chip in which the FET resides. The wider channel region of FET 320 causes a slower performing active device, and could affect the overall performance of the chip. In contrast, the narrower channel region of FET 322 causes a faster performing active device, and could also affect the overall performance of the chip.

As evident from the density map 310 with the two exemplary FETS 320 and 322, the same active device in different locations of the chip with different densities will perform at different speeds due to the width of the polysilicon in the channel. With this known, as is evident from FIG. 3, a chip with an increased density level may be performing at an increased speed, compared to a kerf structure performing at a normalized speed with a medium density, e.g., level of 5 or 6. Similarly, a chip with a decreased density level may be performing at a decreased speed, compared to a kerf structure performing at a normalized speed with a medium density. Consequently, the performance of the kerf structure will not accurately reflect the performance of the low density chip or the high density chip.

Figure 4:
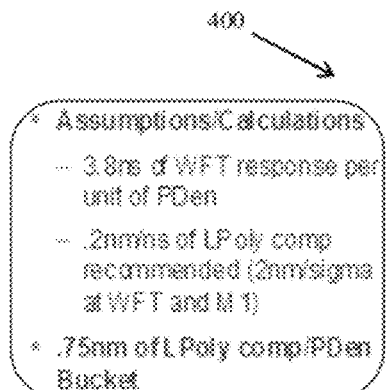
FIG. 4 shows an exemplary table in accordance with aspects of the invention.

FIG. 4 shows an exemplary table 400 that may be used in accordance with aspects of the invention. In embodiments, the table 400 quantifies the Lpoly offset illustrated by FETS 320 and 322 vs. the Pden (perimeter density) of the density map 300. The table 400 takes into consideration the following assumptions/calculations:

(i) 3.8 nS of WFT response per unit of Pden;
(ii) 0.2 nm/nS of LPoly compensation recommended (2 nm/sigma at S\WFT and $1^{st}$ metal level); and
(iii) 0.75 nm of LPoly compensation/Pden bucket.

More specifically, FIG. 4 shows a normalized kerf with a density of 5 to 6 and a normalized surface area (NSA) of 1.60 to 1.72. In this normalized range, there is no Lpoly offset required for a PFET or NFET. However, an exemplary PFET or NFET located at an area of a chip with a density level of 8-9 may have an NSA of 1.96 to 2.08. In this case, the PFET will be running at a faster speed due to its channel width. To compensate for this channel width, e.g., to achieve an optimal density of 5 to 6, the channel width would need to be decreased by about, for example, 3 nm. To compensate for the channel width of the NFET, e.g., to achieve an optimal density of 5 to 6, the channel width would need to be decreased by about, for example, 2 nm. In this example, a delta performance for both the NFET and the PFET for a Lpoly offset is +2.25.

On the other hand, an exemplary PFET or NFET located at an area of a chip with a density level of less than 2 may have an NSA of less than 1.24. In this case, the PFET will be running at a slower speed due to its channel width. To compensate for this channel width, e.g., to achieve an optimal density of 5 to 6, the channel width would need to be increased by about, for example, 4 nm. Similarly, the NFET will be running at a slower speed due to its channel width, in which case the channel width would need to be increased by about, for example, 2 nm. In this example, a delta performance for both the NI-ET and the PFET for an Lpoly offset is −3.0. As discussed herein, this data correlates directly to Idsats and ring oscillator delays. This table can be used to extrapolate other values for both NFET and PFET Lpoly compensation.

Figure 5:
FIG. 5 shows a compensation chart in accordance with aspects of the invention.

FIG. 5 shows an exemplary Pden compensation table 500 that may be used to quantify a kerf ring oscillator offset vs. chip perimeter density in accordance with aspects of the invention. As should be understood by those of skill in the art, the kerf structure itself is not physically changed; however, for this reason, the delay of the kerf structure should thus be adjusted to match the offsets computed for the PFETs and NFETs described in FIG. 4. Accordingly, the Pden compensation table 500 of FIG. 5 may be used to modify a WAC by compensating for delay values using the compensation provided, for example in FIG. 4. Advantageously, with this exemplary data, the optimized targets for future incoming chip designs may be established.

In the example of FIG. 5, the kerf ring oscillator response per unit of Pden is established as 5 nS. In addition, a nominal ring oscillator WAC target is 150-154 nS, which corresponds to a kerf structure with a preferred density of 5 or 6. To compensate for the kerf design, as an illustrative example, a Pden of a chip of less than 2 requires a ring oscillator delay target of less than 135 nS; whereas, a Pden of a chip of greater than 9 results requires a ring oscillator delay target of greater than 169 nS. Accordingly, through the characterization of multiple parts over a range of densities, the kerf structure response per unit of density can be established. It should be understood by those of ordinary skill in the art that other values are also contemplated by the present invention.

Figure 6:
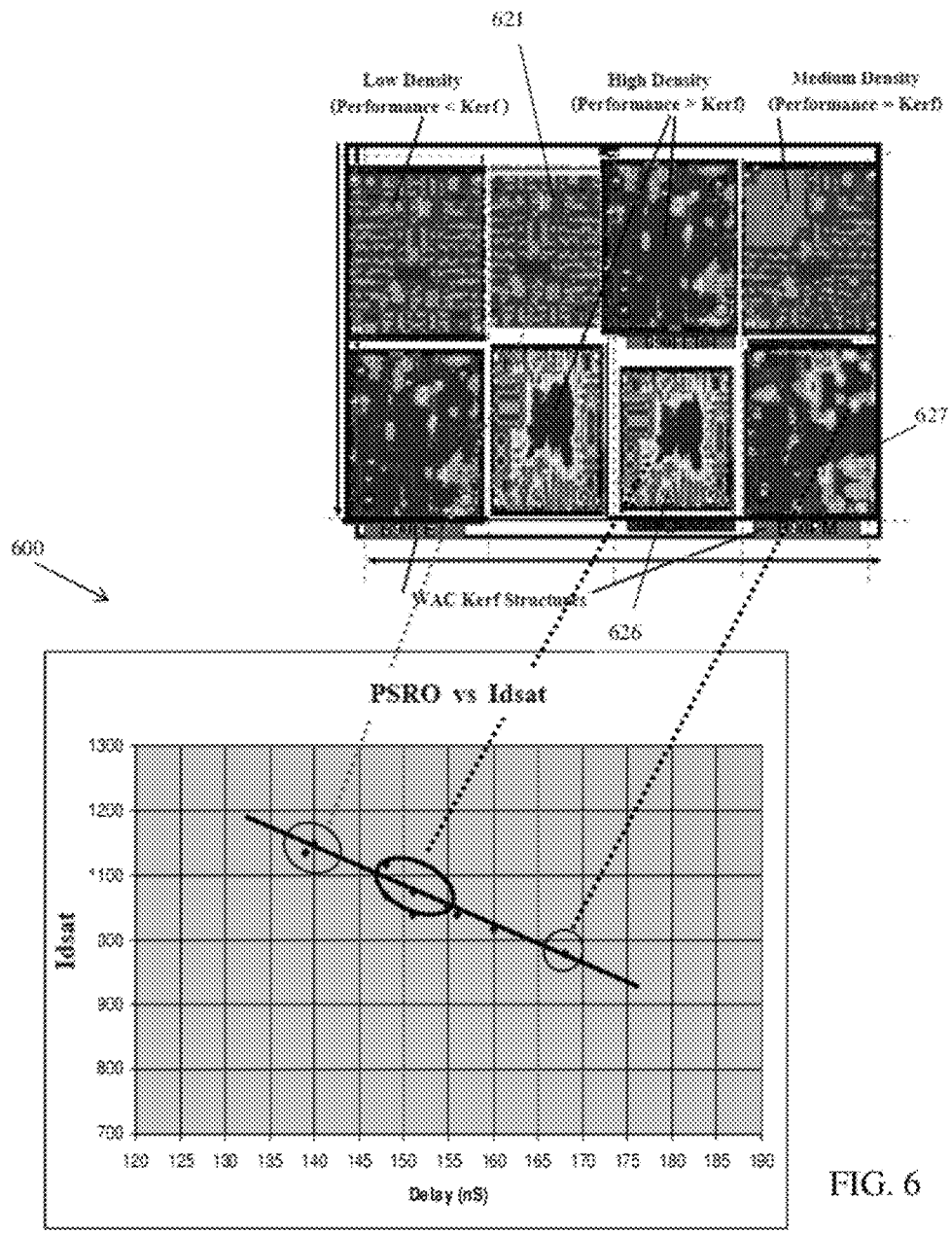
FIG. 6 shows an exemplary graph that illustrates kerf ring oscillator delay vs. Idsat in accordance with aspects of the present invention.

FIG. 6 shows an exemplary graph 600 that illustrates the kerf ring oscillator delay versus Idsat for wafers run with fast, nominal, and slow process splits. The data of graph 600 correlates to the data shown in FIG. 5. For example, a kerf ring oscillator delay target of about 140 nS is used for a low density chip 621. For a medium density chip 626, a kerf ring oscillator delay target of about 150 nS may be used. For a high density chip 627, a kerf ring oscillator delay target of about 165 nS may be used. Thus, the kerf structure target delay may be adjusted accordingly.

Figure 7:
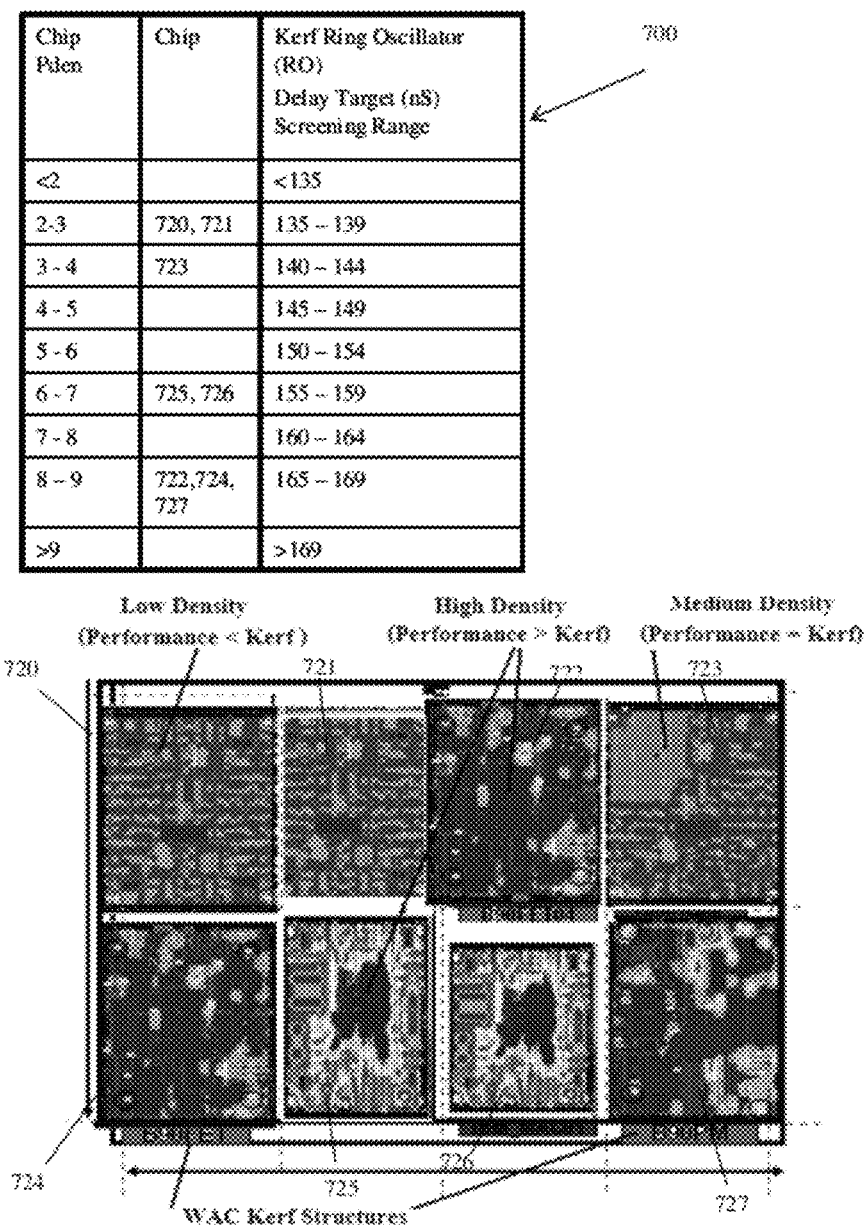
FIG. 7 shows an exemplary table and corresponding density map in accordance with aspects of the present invention.

FIG. 7 shows an exemplary table 700 with optimum screening ranges of the kerf ring oscillator vs. Pden in accordance with aspects of the present invention. The table 700 may be used, for example, to determine screening performance of each chip in order to sort the chips into specific buckets based on the computations above. More specifically, the table 700 shows a kerf ring oscillator delay target of about 135-139 nS for low density chips 720 and 721. Further, the table 700 shows a kerf ring oscillator delay target of about 140-144 nS for medium density chip 723. Further, the table 700 shows a kerf ring oscillator delay target of about 155-159 nS for medium density chips 725 and 726. Further, a kerf ring oscillator delay target of about 165-169 nS is required for high PC density chips 722, 724, and 727. By adjusting the WAC kerf targets based on the density offsets, it is now possible to selectively choose (e.g., custom pick) chips with optimal performance levels from the same reticle field.

Figure 8:
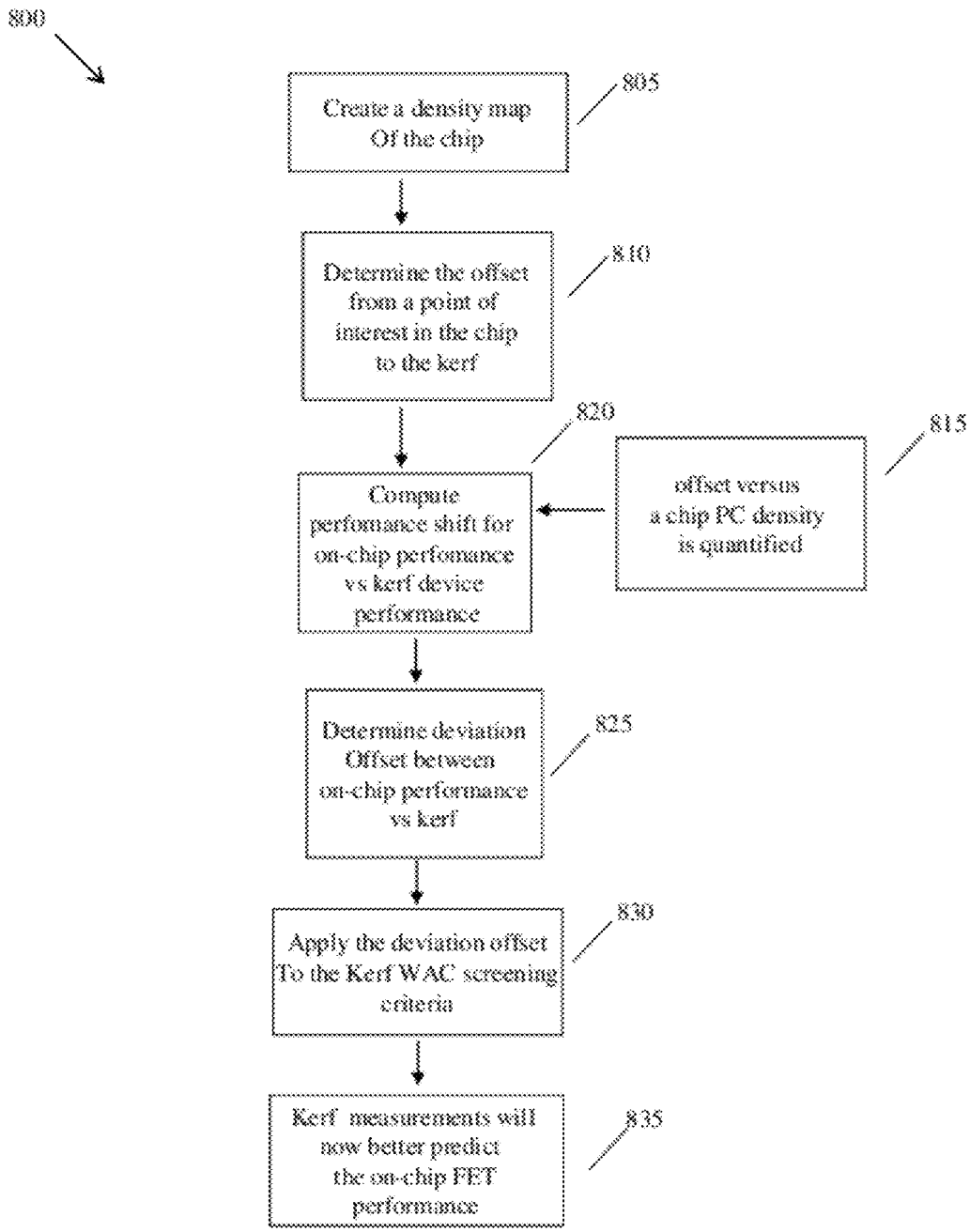
FIG. 8 shows a flow diagram implementing aspects of the present invention.
Figure 9:
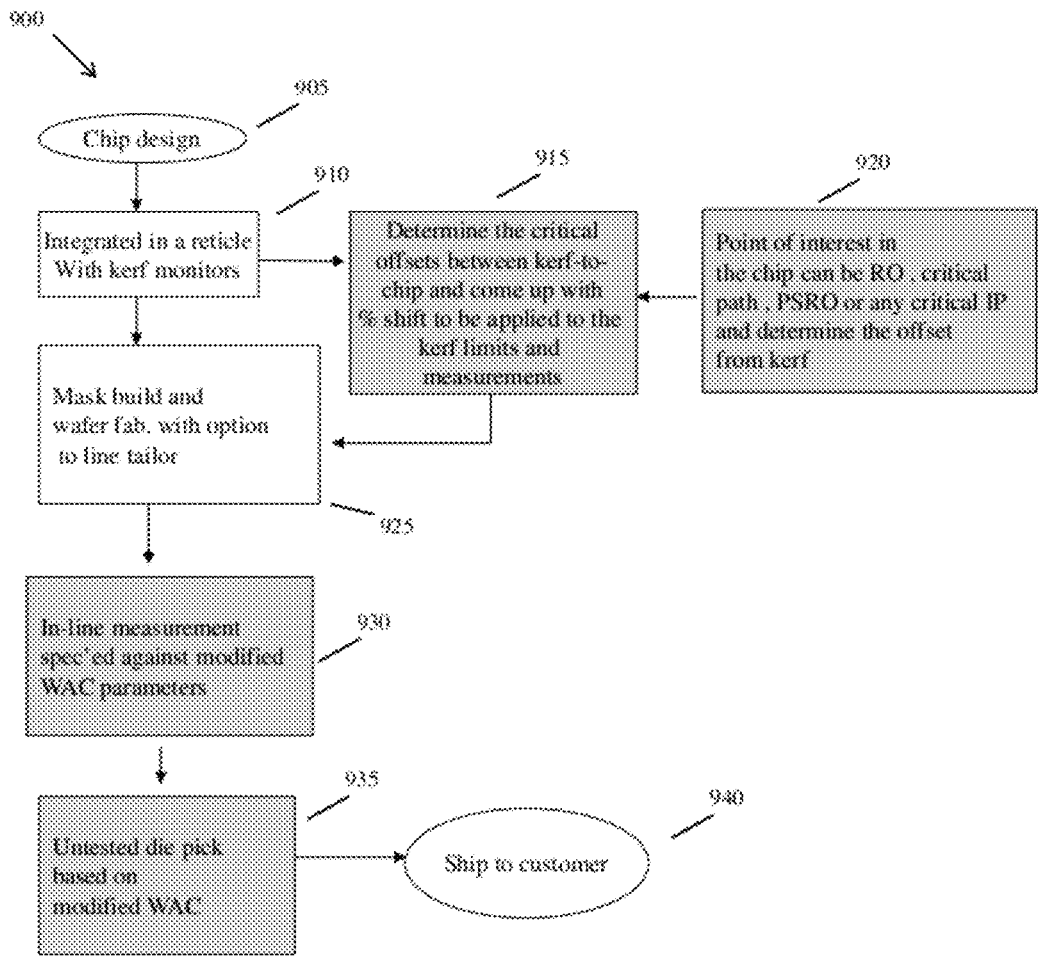
FIG. 9 shows a flow diagram implementing aspects of the present invention.

FIGS. 8 and 9 show a flow diagram implementing aspects of the present invention. The flow diagram of FIGS. 8 and 9 may equally represent a high-level block diagram or a swimlane diagram of the invention. The steps of the flow diagram may be implemented and executed from either a server, in a client server relationship, or they may run on a user workstation with operative information conveyed to the user workstation. Furthermore, the invention can take the form of a computer program product accessible from a computer-usable or computer-readable medium providing program code for use by or in connection with a computer or any instruction execution system. The software and/or computer program product can be implemented in the environment of FIG. 1.

The flowchart of FIGS. 8 and 9 can also illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

More specifically, FIG. 8 shows an exemplary method 800 for determining a kerf-to-chip offset in accordance with aspects of the invention. At step 805, a density map of the chip is generated showing regions of the chip having various density levels, as discussed in detail above with regard to FIGS. 2 and 3. At step 810, a determination is made of an offset from a point of interest in the chip to the kerf structure, as discussed in detail above with regard to FIG. 4. At step 815, an offset versus a chip density is quantified, e.g., a kerf ring oscillator offset versus a chip density is quantified as discussed in detail above with regard to FIG. 5. At step 820, a performance shift is computed for chip performance versus the kerf structure performance, e.g., Idsat (drain saturation current) is computed as discussed in detail above with regard to FIG. 6. At step 825, a deviation offset between on-chip performances versus the kerf is determined, as discussed in detail above with regard to FIG. 7.

At step 830, the deviation offset is applied to the kerf WAC screening criteria. For example in certain aspects of the invention, predefined kerf parameters defined by a WAC that were independent of the chips are offset such that the kerf parameters now track with each chip that the kerf is assigned to screen. At step 835, the kerf measurements can now better predict the on-chip performance, compared to conventional systems. This process can be applied to selecting chips with optimal performance levels from a same reticle field on an MPW. However, additionally this method could also be applied to single product chip wafers to pick chips with optimal performance levels.

FIG. 9 shows an exemplary method 900 for die picking in accordance with aspects of the invention. In step 905, a chip design is received. In step 910, the chip design is integrated in a reticle with kerf monitors. In step 915, the critical offset between kerf-to-chip is determined and a determination is made as to the percent shift to be applied to the kerf limits and measurements. In step 920, a point of interest in the chip is determined to be a ring oscillator, a critical path, a performance sort ring oscillator (PSRO) or any critical structure, and the offset is determined from the kerf. In step 925, a mask is built and wafer fabrication is carried out with the option to line tailor. In step 930, the in-line measurement is specified against modified WAC parameters. In step 935, the untested die is picked based on the modified WAC. In step 940, the untested die is shipped to the customer.

Figure 10:
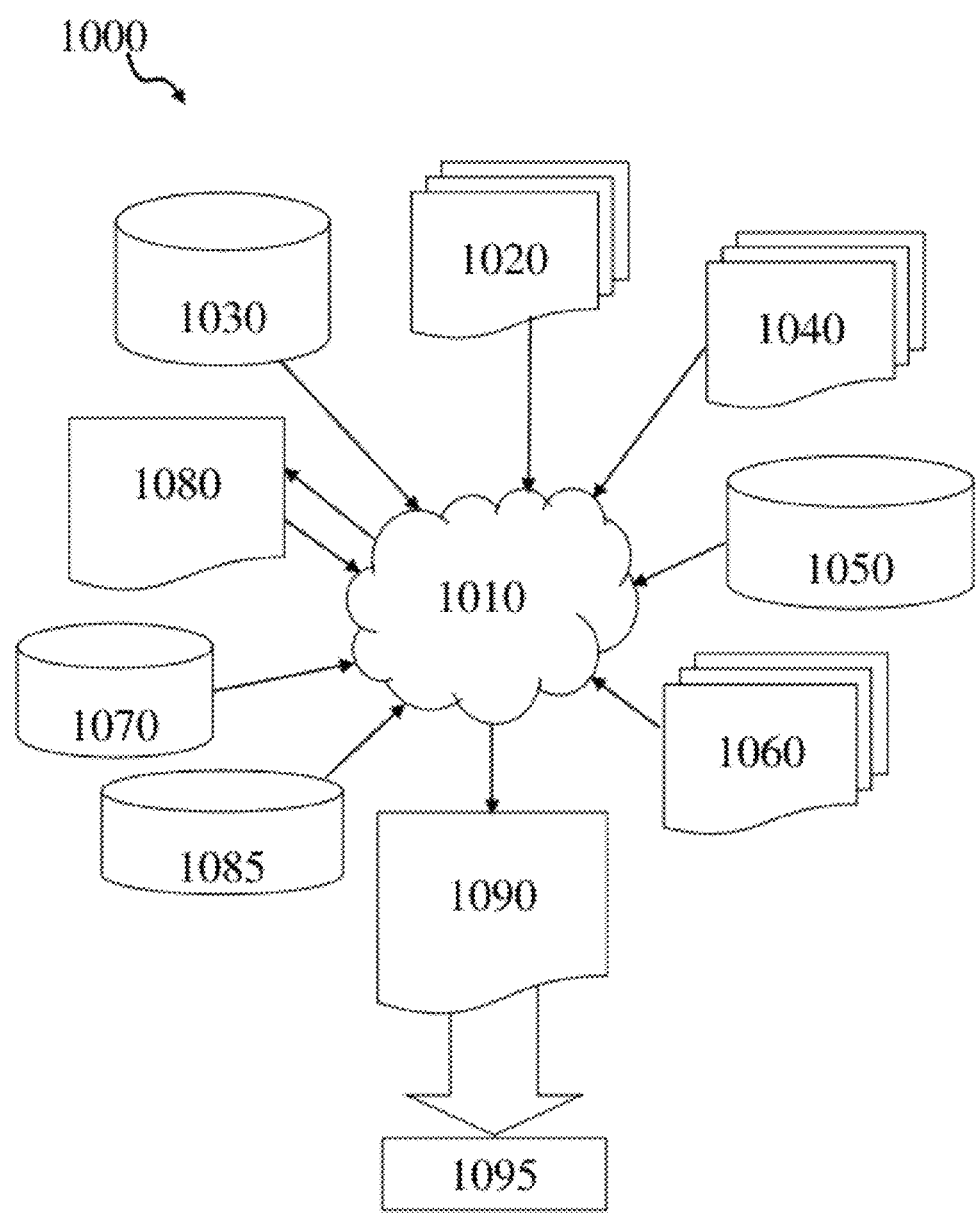
FIG. 10 shows a flow diagram of a design process used in semiconductor design, manufacture, and/or test.

FIG. 10 is a flow diagram of a design process used in semiconductor design, manufacture, and/or test. FIG. 10 shows a block diagram of an exemplary design flow 1000 used for example, in semiconductor IC logic design, simulation, test, layout, and manufacture. Design flow 1000 includes processes, machines and/or mechanisms for processing design structures or devices to generate logically or otherwise functionally equivalent representations of the design structures and/or devices described above. The design structures processed and/or generated by design flow 1000 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1000 may vary depending on the type of representation being designed. For example, a design flow 1000 for building an application specific IC (ASIC) may differ from a design flow 1000 for designing a standard component or from a design flow 1000 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 1020 that is preferably processed by a design process 1010. Design structure 1020 may be a logical simulation design structure generated and processed by design process 1010 to produce a logically equivalent functional representation of a hardware device. Design structure 1020 may also or alternatively comprise data and/or program instructions that when processed by design process 1010, generate a functional representation of the physical structure of a hardware device. Whether representing functional and/or structural design features, design structure 1020 may be generated using electronic computer-aided design (ECAD) such as implemented by a core developer/designer. When encoded on a machine-readable data transmission, gate array, or storage medium, design structure 1020 may be accessed and processed by one or more hardware and/or software modules within design process 1010 to simulate or otherwise functionally represent an electronic component, circuit, electronic or logic module, apparatus, device, or system such as those described above. As such, design structure 1020 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1010 preferably employs and incorporates hardware and/or software modules for synthesizing, translating, or otherwise processing a design/simulation functional equivalent of the components, circuits, devices, or logic structures described above to generate a netlist 1080 which may contain design structures such as design structure 1020. Netlist 1080 may comprise, for example, compiled or otherwise processed data structures representing a list of wires, discrete components, logic gates, control circuits, I/O devices, models, etc. that describes the connections to other elements and circuits in an integrated circuit design. Netlist 1080 may be synthesized using an iterative process in which netlist 1080 is resynthesized one or more times depending on design specifications and parameters for the device. As with other design structure types described herein, netlist 1080 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1010 may include hardware and software modules for processing a variety of input data structure types including netlist 1080. Such data structure types may reside, for example, within library elements 1030 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1040, characterization data 1050, verification data 1060, design rules 1070, and test data files 1085 which may include input test patterns, output test results, and other testing information. Design process 1010 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1010 without deviating from the scope and spirit of the invention. Design process 1010 may also include modules for performing standard circuit design processes such as timing analysis, verification, design rule checking, place and route operations, etc.

Design process 1010 employs and incorporates logic and physical design tools such as HDL compilers and simulation model build tools to process design structure 1020 together with some or all of the depicted supporting data structures along with any additional mechanical design or data (if applicable), to generate a second design structure 1090.

Design structure 1090 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 1020, design structure 1090 preferably comprises one or more files, data structures, or other computer-encoded data or instructions that reside on transmission or data storage media and that when processed by an ECAD system generate a logically or otherwise functionally equivalent form of one or more of the embodiments of the invention as described above. In one embodiment, design structure 1090 may comprise a compiled, executable HDL simulation model that functionally simulates the devices described above.

Design structure 1090 may also employ a data format used for the exchange of layout data of integrated circuits and/or symbolic data format (e.g. information stored in a GDSII (GDS2), GL1, OASIS, map files, or any other suitable format for storing such design data structures). Design structure 1090 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above. Design structure 1090 may then proceed to a stage 1095 where, for example, design structure 1090: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method comprising:
    measuring a density of at least one chip;
    computing a difference in density between the density of the at least one chip and a density of at least one kerf structure;
    quantifying a process or performance offset for the at least one chip based on the computed difference in the density;
    quantifying a kerf ring oscillator offset based on the process or performance offset;
    calculating a kerf ring oscillator delay target to be used for the at least one chip based on the kerf ring oscillator offset;
    adjusting a delay of the at least one kerf structure to match the kerf ring oscillator delay target such that the at least one kerf structure is adjusted to match the process or performance offset quantified for the at least one chip; and
    adjusting parameters of the at least one kerf structure predefined by Wafer Acceptance Criteria (WAC) to match the density difference between the at least one chip and the at least one kerf structure such that performance of the at least one kerf structure with the adjusted delay tracks with performance of the at least one chip
    wherein at least the step of calculating the kerf ring oscillator delay target is performed using a processor.

2. The method of claim 1, further comprising accepting the at least one chip when wafer level measurement of the performance of the at least one kerf structure with the adjusted delay falls within a range of the adjusted parameters of the at least one kerf structure predefined by the WAC.

3. The method of claim 2, further comprising rejecting the at least one chip when the wafer level measurement of the performance of the at least one kerf structure with the adjusted delay falls outside the range of the adjusted parameters of the at least one kerf structure predefined by the WAC.

4. The method of claim 1, wherein the kerf ring oscillator offset is quantified using the process or performance offset, which is an adjusted channel width value.

5. The method of claim 4, wherein the channel width value is adjusted based on the density of the at least one chip, using the density of the kerf structure as a base value.

6. A method comprising:
generating a density map of a chip;
determining a density of the chip using the density map;
determining a difference in density between the density of the chip and a density of the kerf structure;
determining a process or performance offset from a point of interest in the chip to the kerf structure based on the determined difference in the density;
computing a performance shift for chip performance versus kerf structure performance based on the process or performance offset;
calculating a kerf ring oscillator delay target to be used for the chip based on a kerf ring oscillator offset quantified based on the process or performance offset;
adjusting a delay of the kerf structure to match the kerf ring oscillator delay target such that the kerf structure is adjusted to match the process or performance offset;
determining a deviation offset between the chip performance versus the kerf structure performance; and
applying the deviation offset to kerf Wafer Acceptance Criteria (WAC) screening criteria such that the kerf structure performance with the adjusted delay tracks with the chip performance,
wherein at least the step of calculating the kerf ring oscillator delay target is performed using a processor.

7. The method of claim 6, further comprising specifying an in-line measurement against the offset kerf WAC screening criteria.

8. The method of claim 7, further comprising:
picking an untested chip based on the offset kerf WAC screening criteria; and
shipping the untested chip to a customer.

9. The method of claim 6, wherein the generating the density map of the chip comprises generating a heat map that shows density variations of the chip.

10. The method of claim 9, wherein the density map is indicative of performance of the chip or regions within the chip relative to the kerf structure.

11. The method of claim 9, wherein the chip is on a multi-project wafer (MPW).

12. The method of claim 9, further comprising quantifying the kerf ring oscillator offset based on the process or performance offset.

13. The method of claim 12, wherein the quantifying the kerf ring oscillator offset is accomplished by characterization of multiple parts over a range of densities.

14. The method of claim 6, wherein the point of interest is one of a ring oscillator, a critical path, a performance sort ring oscillator (PSRO), or a critical structure.

15. The method of claim 6, selectively choosing chips with optimal performance levels from reticle fields based on the modified kerf WAC screening criteria.

16. A computer system for untested chip selection, the system comprising:
a CPU, a computer readable memory, and a computer readable storage media;
program instructions to measure a density of at least one chip;
program instructions to compute a difference in density between the density of the at least one chip and a density of at least one kerf structure;
program instructions to quantifying a process or performance offset for the at least one chip based on the computed difference in the density;
program instructions to quantifying a kerf ring oscillator offset based on the process or performance offset;
program instructions to adjusting a delay of the at least one kerf structure to match the kerf ring oscillator delay target such that the at least one kerf structure is adjusted to match the process or performance offset quantified for the at least one chip;
program instructions to adjust parameters of the at least one kerf structure predefined by Wafer Acceptance Criteria (WAC) to match the density difference between the at least one chip and the at least one kerf structure; and
program instructions to apply the offset value to the WAC for a wafer level measurement in order to increase chip yield performance such that performance of the at least one kerf structure with the adjusted delay track with the at least one chip,
wherein the program instructions are stored on the computer readable storage media for execution by the CPU via the computer readable memory.

17. The computer system according to claim 16, further comprising program instructions to accept the at least one chip when wafer level measurement of the performance of the at least one kerf structure with the adjusted delay falls within a range of the adjusted parameters of the at least one kerf structure predefined by the WAC.

18. The computer system according to claim 17, further comprising program instructions to reject the at least one chip when the wafer level measurement of the performance of the at least one kerf structure with the adjusted delay falls outside the range of the adjusted parameters of the at least one kerf structure predefined by the WAC.

19. The computer system according to claim 16, further comprising a testing manager and at least one measurement device.

20. The computer system according to claim 19, wherein the testing manager executes the program instructions, and the measurement device measures the density of the at least one chip.

* * * * *